United States Patent
Han

(10) Patent No.: US 6,266,120 B1
(45) Date of Patent: Jul. 24, 2001

(54) DUMMY PAD, A PRINTED CIRCUIT BOARD INCLUDING THE SAME, AND A LIQUID CRYSTAL DISPLAY INCLUDING THE SAME

(75) Inventor: Young-Lyoul Han, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/200,577

(22) Filed: Nov. 27, 1998

(30) Foreign Application Priority Data

Nov. 27, 1997 (KR) .................................................. 97-63345

(51) Int. Cl.$^7$ ................................................. G02F 1/1345
(52) U.S. Cl. ........................ 349/150; 349/149; 349/151; 349/152
(58) Field of Search ................................... 349/150, 149, 349/151, 152

(56) References Cited

U.S. PATENT DOCUMENTS

| | | | |
|---|---|---|---|
| 4,835,345 | * | 5/1989 | Haarde ................................ 174/68.5 |
| 5,402,255 | * | 3/1995 | Nakanishi et al. .................... 349/150 |
| 5,463,191 | * | 10/1995 | Bell et al. ............................ 174/263 |
| 5,587,885 | * | 12/1996 | Swamy ................................. 361/777 |
| 5,729,316 | * | 3/1998 | Yamamura et al. .................. 349/150 |
| 5,822,030 | * | 10/1998 | Uchiyama ............................. 349/150 |
| 6,075,710 | * | 6/2000 | Lau ...................................... 361/760 |

* cited by examiner

*Primary Examiner*—William L. Sikes
*Assistant Examiner*—Julie Ngo
(74) *Attorney, Agent, or Firm*—Howrey Simon Arnold & White, LLP

(57) ABSTRACT

A dummy pad of a printed circuit board for display, delivering reference voltage, ground voltage or common voltage is divided into two portions and has a connection. The connection connects the two portions and is smaller than the two portions. The dummy pad of the printed circuit board is wider than a dummy pad of a soldering pad portion of a tape auto bonding-integrated circuit. Because the amount of the printed solder on the dummy pad of the printed circuit board is easily controlled, the heights of the solder drops is easily made to be equal, a soldering having a uniform adhesive strength is obtained. Furthermore, when the amount of the printed solder is different because the printed solder on one portion flows onto the other portion through the connection, the defects due to excessive solder and insufficient solder are reduced. Because the dummy pad of the printed circuit board is wider than the dummy pad of the tape auto bonding-integrated circuit and thus the solder covers the sides of the dummy pad of the tape auto bonding-integrated circuit, the adhesion of the soldering is reinforced.

6 Claims, 3 Drawing Sheets

DUMMY PAD, A PRINTED CIRCUIT BOARD INCLUDING THE SAME, AND A LIQUID CRYSTAL DISPLAY INCLUDING THE SAME

BACKGROUND OF THE INVENTION (a) Field of the Invention

The present invention relates to a dummy pad, a printed circuit board including the same, and a liquid crystal display including the same.

(b) Description of the Related Art

Generally, a liquid crystal display includes a display panel, a TAB-IC (tape automated bonding integrated circuit) and a PCB (printed circuit board). They are electrically connected to each other through pads formed therein, and the TAB-IC has a soldering pad portion and an OLB (out lead bonding) pad portion. Here, the TAB-IC and the PCB are connected to each other by soldering pads of the soldering pad portion of the TAB-IC and of the pad portion of the PCB.

A soldering pad portion of the TAB-IC and a pad portion of the PCB have signal pads delivering scanning signals or image signals, and dummy pads, which are located near the edges of the soldering pad portion of the TAB-IC a and the pad portion of the PCB, delivering reference voltage, ground voltage or common voltage. The sizes of most signal pads are similar, but the sizes of the dummy pads are twice or triple as large as the size of the signal pads.

In the meantime, the pads of the TAB-IC and of the PCB are soldered by the flowing steps. Solder layers are printed on the pads of the pad portion of the PCB. The solder layers are melted by reflow process to form solder drops. Finally, the solder drops are melted again and the pads are adhered by applying pressure. It is desirable that the heights of the solder drops on the pads are equal. It is because unequal heights of the solder drops on the pads generate the microcrack or microgaps between the pads and the solder layers. However, because the areas of the dummy pads are larger than those of the signal pads and the sizes of the openings of the printing mask are substantially equal to the sizes of the pads, it is difficult to adjust the amount of the solder on the dummy pads such that the heights of the melted solder drops are equal. In addition, if the amount of the printed solder on the dummy pads is excessive, the adjacent pads may be short-circuited, while if insufficient amount of the solder causes the reliability of the soldering to be reduced.

SUMMARY OF THE INVENTION

It is therefore an object of the present invention to improve the reliability of the soldering of a PCB and a TAB-IC.

It is another object of the present invention to reduce the problems due to excessive and insufficient amount of solder.

These and other objects are provided, according to the present invention, by providing a dummy pad of a PCB having two divided portions and at least one connection which connects the two portions and is smaller than the two portions.

It is preferable that the dummy pad is wider than the dummy pad of a TAB-IC to be adhered thereto.

Because the dummy pad according to the present invention are divided into smaller portions, it is easy to control the amount of the solder to be printed on the dummy pad since the size of the opening of a print mask corresponding to the dummy pad.

Furthermore, when the amounts of the solders printed on the two portions are different from each other, the melted solder on one portion flows into the other portion through at least one connection portion.

Here, if the dummy pad of the PCB is wider than the dummy pad of a TAB-IC, the sides of the dummy pad of the TAB-IC are soldered.

DETAILED DESCRIPTION OF THE PREFERRED EMBODIMENTS

Figure 1:
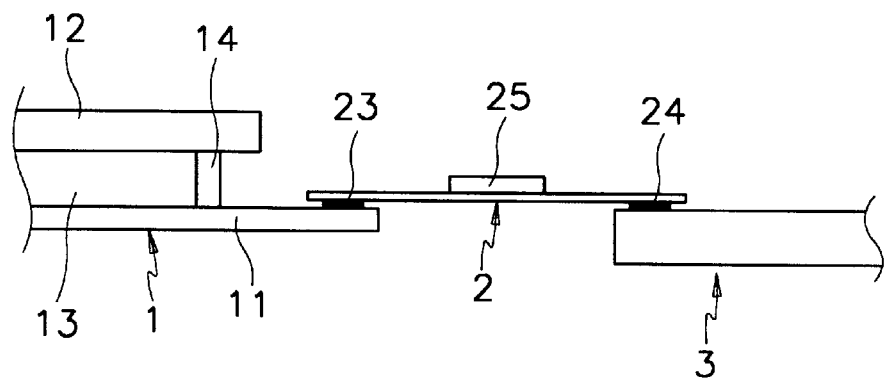
FIGS. 1 and 2 are schematic diagrams showing a liquid crystal display according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosures will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
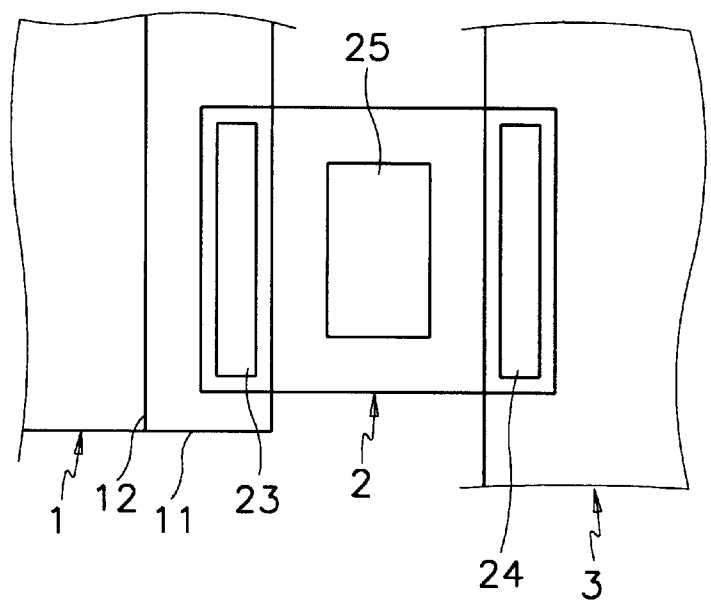

FIGS. 1 and 2 are schematic diagrams showing a liquid crystal display according to an embodiment of the present invention.

As shown in FIGS. 1 and 2, a TAB-IC 2 is connected to the display panel 1 at an OLB pad portion 23 of the TAB-IC 2, and connected to the PCB 3 at a soldering pad portion 24 of the TAB-IC 2.

The display panel 1 includes a lower substrate 11, the upper substrate 12 opposite to the lower substrate 11, a liquid crystal layer 13 injected in between the two substrates 11 and 12, and a sealant 14 enclosing the liquid crystal layer 13. A driver chip 25 is mounted on the center of the TAB-IC 2.

In this liquid crystal display, the driver chip 25 converts a signal from the PCB 3 via the soldering pad portion 24 of the TAB-IC 2 into a driver signal to drive the display panel 1, and the driver signal is delivered to wires of the display panel 1 through a plurality of the pads and terminals formed in the OLB pad portion 23 of the TAB-IC 2.

Now, a pad pattern formed in the pad portion of the PCB 3 is described in detail with reference to FIG. 3.

Figure 3:
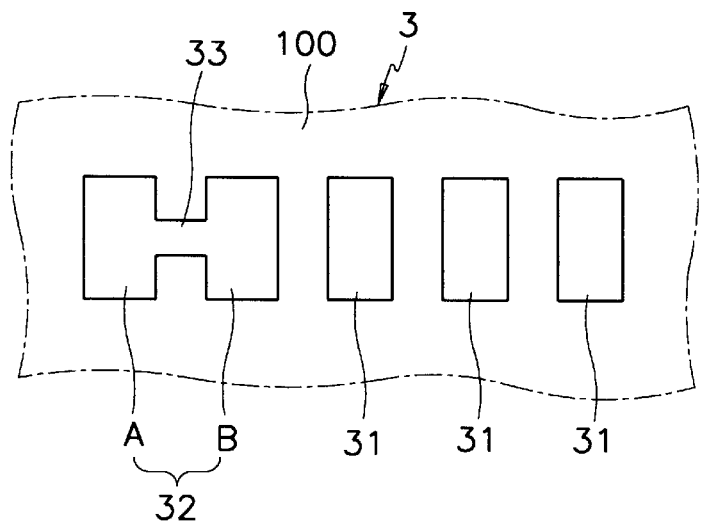
FIG. 3 is a plan view of a pad pattern formed on a PCB according to an embodiment of the present invention.

FIG. 3 is a plan view of a pad pattern formed on a PCB according to an embodiment of the present invention.

As shown in FIG. 3, a plurality of signal pads 31 arranged in a uniform distance are formed on an insulating substrate 100 in the PCB 3. A dummy pad 32 which includes two portions A and B and a connecting portion 33 connecting the portions A and B to each other formed near the signal pads 31. Each portion A and B may be as large as the signal pads 31 and the connecting portion is smaller than each portion A and B.

Because the dummy pad 32 is divided into small portions A and B, it is easy to control the amount of the solder to be printed on the two portions A and B. That is to say, since the sizes of the portions A and B are small, the size of openings of printing mask becomes small, and thus it is easy to control the amount of the solder. Accordingly, the heights of solder drops formed by the reflow of solder layers may be uniform.

Furthermore, if the solder is printed on either of the portions A or B or the amounts of the printed solders thereon are unequal, the melted solder on the portion A or B flows into the other portion via the connection 33 when adhering the PCB 3 and the TAB-IC 2. Accordingly, the reliability of the soldering is improved.

Next, the process of electrically connecting the PCB 3 and the TAB-IC 2 is described in detail.

Figure 4A:
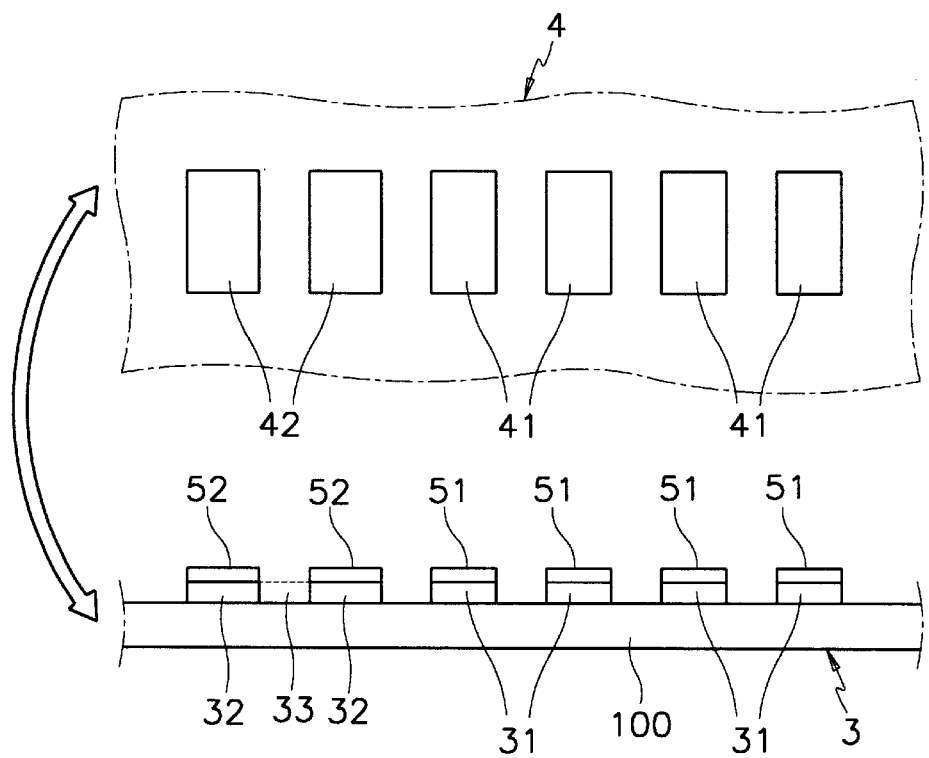
FIGS. 4A to 4C are sectional views illustrating a soldering process of a PCB and a TAB-IC.
Figure 4B:
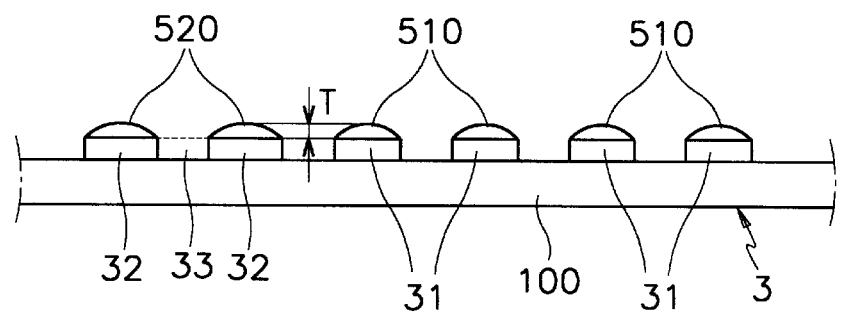
Figure 4C:
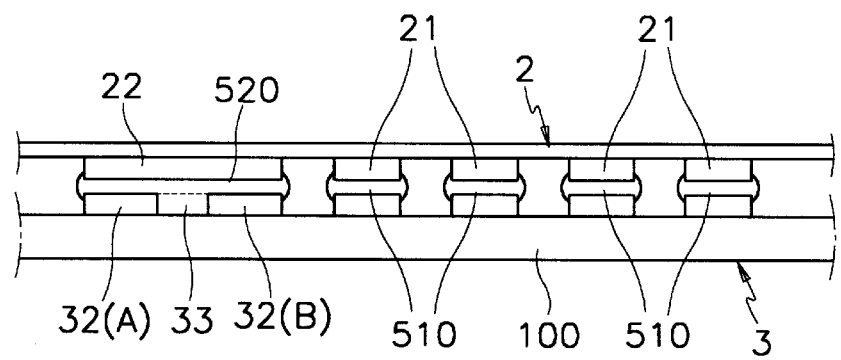
Figure 5:
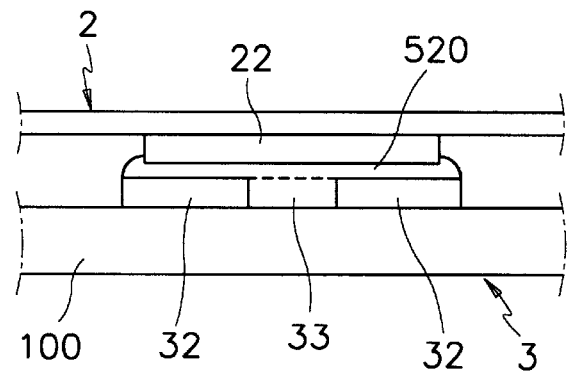
FIG. 5 is a sectional view illustrating a soldered structure of a PCB and a TAB-IC.

FIGS. 4A to 4C are sectional views illustrating a soldering process of a PCB and a TAB-IC, and FIG. 5 is a sectional view illustrating a soldered structure of a PCB and a TAB-IC.

First, as shown in FIG. 4A, a mask 4, having openings 41 and 42 corresponding to signal pads 31 and a dummy pad 32 on a PCB 3, is aligned with the PCB 3, and then solder layers 51 and 52 are printed on the signal pads 31 and the dummy pad 32 by using screen print method. At this time, a solder layer may not be printed, or may be printed on the connection 33.

Since the size of the openings 42 of the mask 4 corresponding to the dummy pad 32 is reduced, it is easy to control the amount of the solder to be printed on the dummy pad 32.

Next, as shown in FIG. 4B, the printed solder layers 51 and 52 on the pads 31 and 32 are melted through reflow at the temperature in the range of 300~350° C., preferably 320±10° C.

Then, the solder layers 51 and 52 on the pads 31 and 32 melt into solder drops 510 and 520 having a convex surface.

Here, to easily control the amount of the printed solder 52 on the dummy pad 32 means to make the heights T of the solder drops 510 and 520 to be equal. Accordingly, the problems due to unequal height of solder drops in the hot press process of the conventional art are reduced.

It is preferable that the height T of solder drops 510 and 520 is in the range of 50~120 $\mu$m, more preferably 60~90 $\mu$m.

Next, as shown in FIG. 4C, the PCB 3 and the TAB-IC 2 having a plurality of pads 21 and 22 are aligned and attached to each other through the hot press process. At this time, the solder drops 510 and 520 are remelted to adhere to the pads.

When a portion of the dummy pad is lack of solder, the melted solder on the other portion flows onto the portion having insufficient solder through the connection 33. On the contrary, when a portion has excessive solder, the excessive solder flows onto the other portion. As a result, the uniform soldering having a wide area is completed.

Furthermore, it is preferable that the dummy pad 32 of the PCB 3 is wider than the dummy pad 22 of the TAB-IC 2 since the melted solder preferably cover the side surfaces of the dummy pad 22 of the TAB-IC 2.

According to the embodiments of the present invention, since a dummy pad of a pad pattern has two portions and at least one connection connecting two portions to each other, the heights of melted solder drops may be equal, and the defects due to insufficient and excessive solder are reduced. As a result, the reliability of the soldering is improved. Furthermore, by forming the dummy pad of the PCB to be wider than the dummy pad of the TAB-IC, the adhesion of the solder is reinforced.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A liquid crystal display, comprising:

a liquid crystal panel having a first substrate, a second substrate, and a liquid crystal layer injected between the first substrate and the second substrate;

a tape auto boding integrated-circuit that comprises a soldering pad portion having a first signal pad that provides scanning signals or image signals and a first dummy pad that provides reference voltages, ground voltages or common voltages, and a driver chip; and a printed circuit board including a second signal pad corresponding to the first signal pad, and a second dummy pad corresponding to the first dummy pad, wherein the second dummy pad is divided into a plurality of portions and a connecting portion connects the plurality of portions.

2. The liquid crystal display of claim 1, wherein the connecting portion is smaller than each of the plurality of portions.

3. The liquid crystal display of claim 2, wherein the second dummy pad of the printed circuit board is wider than the first dummy pad of the tape auto bonding integrated-circuit.

4. A liquid crystal display, comprising:

a liquid crystal panel having a first substrate, a second substrate, and a liquid crystal layer injected between the first substrate and the second substrate;

a tap auto bonding integrated-circuit that comprises a soldering pad portion having a first signal pad that provides scanning signals or image signals and a first dummy pad that provides reference voltages, ground voltages or common voltages, and a driver chip; and a printed circuit board including a second signal pad corresponding to the first signal pad, and a second dummy pad corresponding to the first dummy pad, wherein the second dummy pad is divided into a plurality of portions;

wherein each of the plurality of portions is of substantially same size as the second signal pad; and wherein a connecting portion connects the plurality of portions.

5. The liquid crystal display of claim 4, wherein the connecting portion is smaller that each of the plurality of portions.

6. A liquid crystal display, comprising:

a liquid crystal panel having a first substrate, a second substrate, and a liquid crystal layer injected between the first substrate and the second substrate;

a tape auto bonding integrated-circuit that comprises a soldering pad portion having a first signal pad that provides scanning signals or image signals and a first dummy pad that provides reference voltages, ground voltages or common voltages, and a driver chip; and a printed circuit board including a second signal pad corresponding to the first signal pad, and a second dummy pad corresponding to the first dummy pad, wherein the second dummy pad is divided into a plurality of portions;

wherein a connecting portion connects the plurality of portions; and wherein at least one connection connecting the plurality of portions is smaller than each of the plurality of portions.

* * * * *